United States Patent
Na

[11] Patent Number: 5,986,963
[45] Date of Patent: Nov. 16, 1999

[54] WRITE CONTROL DRIVER CIRCUIT

[75] Inventor: Joon-Ho Na, Chooncheongbuk-Do, Rep. of Korea

[73] Assignee: LG Semicon Co., Ltd., Cheongju, Rep. of Korea

[21] Appl. No.: 09/061,034

[22] Filed: Apr. 16, 1998

[30] Foreign Application Priority Data

Oct. 10, 1997 [KR] Rep. of Korea .................. 97/51953

[51] Int. Cl.[6] .................................................. G11C 8/00
[52] U.S. Cl. .......................... 365/230.01; 365/189.04; 365/194; 365/233; 365/5; 365/189.08
[58] Field of Search ........................ 365/233.5, 189.05, 365/185.17, 194, 93, 230.06, 189.08, 230.01, 191, 189.04

[56] References Cited

U.S. PATENT DOCUMENTS

| | | | |
|---|---|---|---|
| 4,744,063 | 5/1988 | Ohtani et al. ............... | 365/233 |
| 5,307,324 | 4/1994 | Nishimoto ................... | 365/233.5 |
| 5,548,560 | 8/1996 | Stephens, Jr. et al. ....... | 365/233.5 |
| 5,740,123 | 4/1998 | Uchida ....................... | 365/233 |
| 5,825,693 | 10/1998 | Lee et al. ................... | 365/189.05 |

*Primary Examiner*—David Nelms
*Assistant Examiner*—Thong Le
*Attorney, Agent, or Firm*—Fleshner & Kim

[57] ABSTRACT

A write control driver circuit writes a data in a high-speed semiconductor chip by obtaining an earlier enabling time of a write control signal. The circuit includes a first logic circuit unit that outputs a first pulse signal of an address transition detection signal based on an input write enable signal, a second pulse signal of an address transition detection signal generated after the first pulse signal, and a delay control signal in which the first pulse signal is removed when the first and second pulse signals are inputted thereto. A second logic circuit unit that receives the delay control signal and a coding signal and output a write control signal.

23 Claims, 4 Drawing Sheets

FIG.2A BACKGROUND ART — ADD
FIG.2B BACKGROUND ART — WE.CS
FIG.2C BACKGROUND ART — WEZ
FIG.2D BACKGROUND ART — ATDST
FIG.2E BACKGROUND ART — ATDSB
FIG.2F BACKGROUND ART — ATDS
FIG.2G BACKGROUND ART — WC
FIG.2H BACKGROUND ART — DATA/DATAB

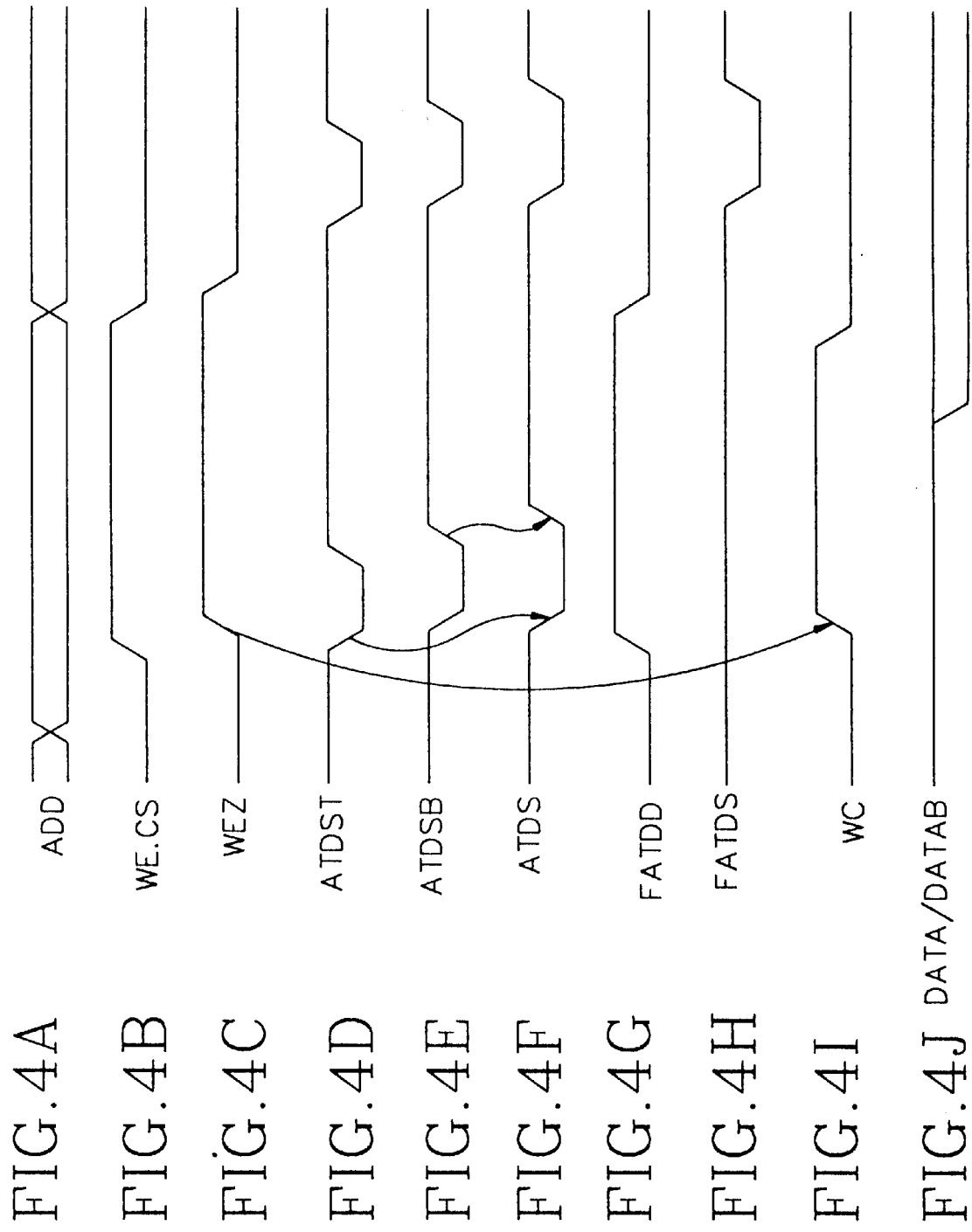

WRITE CONTROL DRIVER CIRCUIT

BACKGROUND OF THE INVENTION

1. Field of the Invention

The present invention relates to a semiconductor device and in particular, to a write control driver circuit for a high speed semiconductor device.

2. Background of the Related Art

FIG. 1 illustrates a related art write control driver circuit that includes a NAND-gate NAND11 for receiving a peri-top address transition detection signal ATDST and a peri-bottom address transition detection signal ATDSB, respectively. An inverter IN11 inverts an output signal from the NAND11 to output an address transition detection signal ATDS. A NAND-gate NAND12 receives a write enable signal WE and a chip selection signal CS. An inverter IN12 inverts an output signal from the NAND-gate NAND12 to output a write driver signal WD. A NAND-gate NAND13 receives a coding signal WEZ, the write driver signal WD and the combined address transition detection signal ATDS. An inverter IN13 inverts an output signal from the NAND-gate NAND13 to output a write control signal WC to a data transmission unit DT.

The peri-top address transition detection signal ATDST is a signal that is obtained by adding the address transition detection signals at the peri-top, and the peri-bottom address transition detection signal ATDSB is a signal that is obtained by adding the address transition detection signals at a peri-bottom. The write control signal WC is used to control the write operation where data from a data input buffer (not shown) is written onto a cell. In other words, the write control signal WC is a signal for enabling the data transmission unit DT.

The operation of the related art write control driver circuit will now be described. First, as shown in FIGS. 2D-2E, the peri-top address transition detection signal ATDST and the peri-bottom address transition detection signal ATDSB are generated by an address signal ADD, which is shown in FIG. 2A. The peri-top address transition detection signal ATDST and the peri-bottom address transition signal ATDSB are NANDed by the NAND-gate NAND11 and the result is inverted by the inverter IN11 to output the combined address transition detection signal ATDS. As shown in FIG. 2F, the pulse width of the combined address transition detection signal ATDS becomes wider than that of the individual peri-top address transition detection signal ATDST and the peri-bottom address transition detection signal ATDSB by a loading difference between the peri-top address transition detection signal ATDST and the peri-bottom address transition detection signal ATDSB.

In addition, the write enable signal WE and the chip selection signal CS are NANDed by the NAND-gate NAND12 and the result is inverted by the inverter IN12 to output the write driver signal WD. The write driver signal WD, the combined address transition detection signal ATDS, and the coding signal WEZ are NANDed by the NAND-gate NAND 13, and the result is inverted by the inverter IN13 to output the write control signal WC. The coding signal WBZ is preferably a signal output when the write enable signal WE and the signal from a Z-decoder (not shown) are combined by a NAND-gate (not shown).

When the write control signal WC is transited to a high level as shown in FIG. 2G, the data transmission unit DT is enabled and controlled by the write transmission transistor enable signal CWE. Accordingly, input data DATAIN from a data input buffer (not shown) is transmitted to and written into a cell as output data DATA and DATAB as shown in FIG. 2H. The write transmission transistor enable signal CWE is a signal for controlling a transmission transistor (not shown) of the data transmission unit DT.

Therefore, in the related art write control driver circuit, the write control signal WC is triggered when the combined address transition detection signal ATDS is transited to a high level. Since the pulse width of the combined address transition detection signal ATDS is wider than that of the two address transition detection signals ATDST and ATDSB, the write control signal WC is delayed by a predetermined time corresponding to the enabling time. For example, assume that the pulse width of the two address transition detection signals ATDST and ATDSB is 4 ns, and the peri-top address transition detection signal ATDST is delayed by 2 ns (rather than the peri-bottom address transition detection signal ATDSB) and then is loaded. In this case, the pulse width of the combined address transition detection signal ATDS is increased to 6 ns.

Therefore, in a high speed chip, it is becomes very difficult to accurately write the data onto the cells. For example, assume that a write AC parameter tAw is 12 ns in an operational requirements specification of a 1M SRAM. In the related art write control drive circuit, the signals are delayed by the combined address transition detection signal ATDS by 6 ns, a cell loading by 5 ns, and a write AC parameter margin tAs by 2 ns, respectively. Accordingly, the total delay time becomes 13 ns, which exceeds the write AC parameter tAw specification.

The above references are incorporated by reference herein where appropriate for appropriate teachings of additional or alternative details, features and/or technical background.

SUMMARY OF THE INVENTION

An object of the present invention is to provide a write control driver circuit that substantially overcomes at least the aforementioned problems encountered in the related art.

Another object of the present invention is to provide a write control driver circuit that accurately writes data in a high speed chip.

A further object of the present invention is to provide a write control circuit that performs earlier enable timing of a write control signal.

To achieve at least the above objects in a whole or in parts, there is provided a write control driver circuit according to the present invention that includes a first logic circuit unit for outputting a first pulse signal of an address transition detection signal that is outputted when a write enable signal is applied, a second pulse signal of an address transition detection signal that is generated after the first pulse signal, and a delay control signal in which the first pulse signal is removed when the first and second pulse signals are inputted thereto, and a second logic circuit unit for outputting a coding signal that is obtained by combining the write enable signal and the output signal from the decoder and a write control signal when the delay control signal and coding signal are inputted thereto.

To further achieve the above objects in a whole or in parts, there is provided a write control driver circuit according to the present invention that includes a first NAND-gate for receiving a peri-top address transition detection signal and a peri-bottom address transition detection, an inverter for inverting an output signal from the first NAND-gate, a second NAND-gate for receiving a write enable signal and a chip selection signal, a first delay unit for delaying an output signal from the second NAND-gate, a first NOR-gate for receiving an output signal from the second NAND-gate and an output from the first delay unit, a second delay unit for delaying an output from the first NOR-gate, a second NOR-gate for receiving an output signal from the first NAND-gate and an output signal from the second delay unit, a third NAND-gate for receiving an output signal from the second NOR-gate via an inverter and a coding signal, and an inverter for inverting an output signal from the NAND-gate to output a write control signal.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein:

FIGS. 2A–2H are diagrams illustrating operational timing signals of FIG. 1;

FIGS. 4A–4J are diagrams illustrating operational timing of signals of FIG. 3.

DETAILED DESCRIPTION OF PREFERRED EMBODIMENTS

Figure 1:
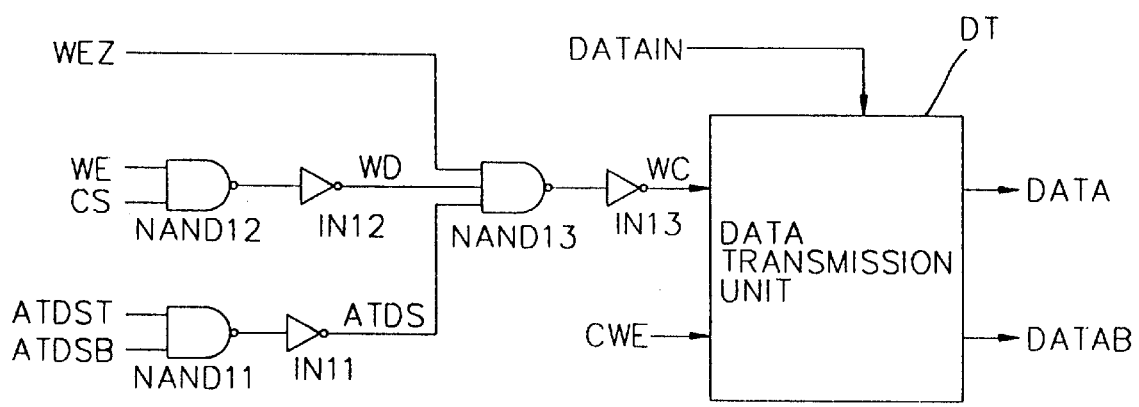
FIG. 1 is a circuit diagram illustrating a related art write control driver circuit.
Figure 3:
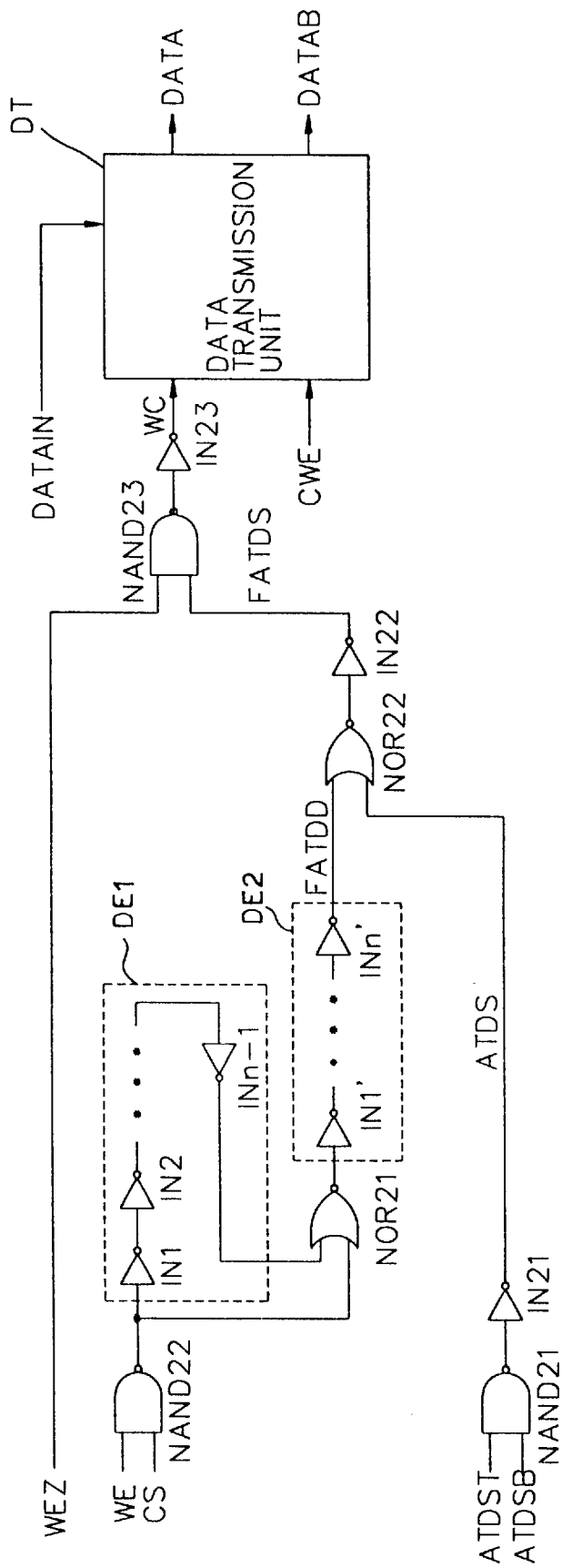
FIG. 3 is a diagram illustrating a write control driver circuit according to a preferred embodiment of the present invention.

As shown in FIG. 3, a preferred embodiment of a write control driver circuit according to the present invention includes a NAND-gate NAND21 for receiving a peri-top address transition signal ATDST and a peri-bottom address transition detection signal ATDSB and an inverter IN21 for inverting the output signal from the NAND-gate NAND21. A NAND-gate NAND22 receives a write enable signal WE and a chip selection signal CS and a first delay unit DE1 delays the output signal from the NAND-gate NAND22. A NOR-gate NOR21 receives the output signal from the NAND-gate NAND22 and the output signal from the first delay unit DE1. A second delay unit DE2 delays the output signal from the NOR-gate NOR21.

A NOR-gate NOR22 receives the output signal from the inverter IN 21 and the output signal from the second delay unit DE2. An inverter IN22 inverts the output signal from the NOR-gate NOR22. A NAND-gate NAND23 receives the output signal from the inverter IN22 and the coding signal WEZ, and an inverter IN23 inverts the output signal from the NAND-gate NAND23 to output the write control signal WC to a data transmission unit DT. The first delay unit DE1 preferably includes an odd number of series coupled inverters, and the second delay unit DE2 preferably includes an even number of series coupled inverters.

Operations of the write control driver circuit according to the preferred embodiment of the present invention will now described. As shown in FIGS. 4D-4E, the peri-top address transition detection signal ATDST and the peri-bottom address transition detection signal ATDSB are NANDed by the NAND-gate NAND21 based on an address signal ADD shown in FIG. 4A. The output signal of the NAND-gate NAND21 is inverted by the inverter IN21 to output the address transition detection signal ATDS as shown in FIG. 4F.

The write enable signal WE and the chip selection signal CS are NANDed by the NAND-gate NAND22 and the result is delayed by the first delay unit DE1. Thereafter, the output signal from the NAND-gate NAND22 and the output signal from the first delay unit DE1 are NORed by the NOR-gate NOR21 and delayed by the second delay unit DE2 to output a pulse removal signal FATDD shown in FIG. 4G. The pulse removal signal FATDD Forward ATD Disable Signal) is a signal for removing the pulse signal that delays a previous pulse signal of the address transition detection signal ATDS, namely, the enabling time of the write control signal.

The pulse removal signal FATDD and the address transition detection signal ATDS are NORed by the NOR-gate NOR22 and are inverted by the inverter IN22. Thus, a delay control signal FATDS as shown in FIG. 4H is output by the inverter IN22. Further, the delay control signal FATDS has a previous pulse of the address transition detection signal ATDS removed.

The delay control signal FATDS is a signal in which the previous pulse of the address transition detection signal ATDS combines with the pulse removal signal FATDD, to reduce delaying the enabling time of the write control signal WC. The delay control signal FATDS and the coding signal WEZ shown in FIG. 4C are NANDed by the NAND-gate NAND23 and inverted by the inverter IN23 to output the write control signal WC shown in FIG. 4I. The write control signal WC is transmitted to the data transmission unit DT.

Therefore, since the write control signal WC is triggered when the coding signal WEZ is transited to a high level without a predetermined delay time corresponding to the pulse width of the address transition detection signal ATDS, the data transmission unit DT is enabled when the triggering is started. Thus, the input data DATAIN from the data input buffer (not shown) are converted into output data DATA and DATAB as shown in FIG. 4J and transmitted to be written into the cells.

As described above, in the preferred embodiment of the write control driver circuit according to the present invention has various advantages. The delay circuit and NOR-gates are used to remove the pulses of the address transition detection signal that delay the write enabling time. Therefore, the data transmission and write operation is performed without the delay time corresponding to the pulse width of the address transition detection signal. Accordingly, data can be accurately transmitted in a high speed semiconductor chip.

The foregoing embodiments are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art.

What is claimed is:

1. A write control driver circuit, comprising:
   a first circuit unit that outputs (1) a first pulse signal of an address transition detection signal based on a received write enable signal, and (2) a second pulse signal of an address transition detection signal generated after the first pulse signal, and (3) a delay control signal combining the first and second pulse signals, wherein the first pulse signal is removed from the delay control signal; and a second circuit unit that receives the delay control signal and a coding signal and outputs a write control signal.

2. The circuit of claim 1, further comprising a first circuit that logically processes the write enable signal and an output signal from a Z-decoder to output the coding signal.

3. The circuit of claim 2, wherein the first circuit is a NAND-gate.

4. The circuit of claim 1, wherein said first circuit unit comprises:
 a first circuit that receives the write enable signal and a chip selection signal and outputs a pulse removal signal that removes the first pulse signal; and,
 a second circuit that receives the pulse removal signal and the address transition detection signal and outputs the delay control signal from which the first pulse signal is removed.

5. The circuit of claim 4, wherein the second circuit comprises:
 a NOR-gate that receives the pulse removal signal from the first circuit and an address transition detecting signal; and
 an inverter that receives an output signal from the NOR-gate to output the delay control signal.

6. The circuit of claim 4, wherein said first circuit unit comprises:
 a NAND-gate that receives the write enable signal and chip selection signal;
 a first delay unit that receives an output signal from the NAND-gate;
 a NOR-gate that receives the output signal from the NAND-gate and an output signal from the first delay unit; and
 a second delay unit that receives an output signal from the NOR-gate and outputs the pulse removal signal that removes the first pulse signal.

7. The circuit of claim 6, wherein said first delay unit and second delay unit each comprise a plurality of series coupled inverters.

8. The circuit of claim 6, wherein said first delay unit consists of an odd number of inverters and said second delay unit consists of an even number of inverters.

9. The circuit of claim 1, wherein the first circuit unit further comprises a first circuit that logically processes a peri-top address transition detection signal and a peri-bottom address transition detection signal, which are respectively generated using first and second detections of an address signal, to output the address transition detection signal.

10. The circuit of claim 9, wherein the first circuit comprises:
 a NAND-gate that receives the peri-top address transition detection signal and the peri-bottom address transition signal; and
 an inverter that inverts an output signal of the NAND-gate to output the address transition detection signal.

11. The circuit of claim 1, wherein said second logic circuit unit comprises:
 a NAND-gate that receives the coding signal and the delay control signal; and
 an inverter that inverts an output signal from the NAND-gate to output the write control signal.

12. The circuit of claim 1, further comprising a data transmission unit that is enabled by said write control signal.

13. The circuit of claim 12, wherein said data transmission unit is controlled by a write transmission transistor enable signal to write data from a data input buffer to a cell.

14. A write control driver circuit comprising:
 a first logic-gate that receives a peri-top address transition detection signal and a peri-bottom address transition detection signal;
 a second logic-gate that logically processes an output signal from the first logic-gate;
 a third logic-gate that receives a write enable signal and a chip selection signal;
 a first delay unit that delays an output signal from the third logic-gate;
 a fourth logic-gate that receives an output signal from the third logic-gate and an output from the first delay unit;
 a second delay unit that delays an output signal from the fourth logic-gate;
 a fifth logic-gate that receives an output signal from the second logic-gate and an output signal from the second delay unit;
 a sixth logic-gate that logically processes an output signal from the fifth logic-gate;
 a seventh logic-gate that receives an output signal from the sixth logic-gate and a coding signal; and
 an eighth logic-gate that logically processes an output signal from the seventh logic-gate and outputs a write control signal.

15. The circuit of claim 14, wherein said first delay unit comprises an odd number of series coupled inverters.

16. The circuit of claim 14, wherein said second delay unit comprises an even number of series coupled inverters.

17. The circuit of claim 14, further comprising a NAND-gate that receives a write enable signal and an output signal from a Z-decoder to output the coding signal.

18. The circuit of claim 14, wherein said second, sixth and eighth logic-gates are inverters, said first, third and seventh logic-gates are NAND-gates and said fourth and fifth logic-gates are NOR-gates.

19. A write control driver circuit, comprising:
 a first circuit unit that outputs a first pulse signal of an address transition detection signal based on a received write enable signal, a second pulse signal of an address transition detection signal generated after the first pulse signal, and a delay control signal based on the first and second pulse signals, wherein the first pulse signal is removed from the delay control signal; and
 a second circuit unit that receives the delay control signal and a coding signal and outputs a write control signal, wherein the first pulse signal of the address transition detection signal is generated using first and second detections of a single transition of an address signal.

20. The circuit of claim 19, wherein said first circuit unit comprises:
 a first circuit that receives the write enable signal and a chip selection signal and outputs a pulse removal signal that removes the first pulse signal, wherein said first circuit unit comprises:
  a first logic-gate that receives the write enable signal and chip selection signal,
  a first delay unit that receives an output signal from the first logic-gate,
  a second logic-gate that receives the output signal from the first logic-gate and an output signal from the first delay unit, and
  a second delay unit that receives an output signal from the second logic-gate and outputs the pulse removal signal that removes the first pulse signal;
 a second circuit that receives peri-top and peri-bottom address transition detection signals of the single transition of the address signal; and a logic-gate circuit that receives the pulse removal signal and the address transition detection signal and outputs the delay control signal from which the first pulse signal is removed.

21. A write control driver circuit, comprising:

a first circuit unit that outputs a first pulse signal of an address transition detection signal based on a received write enable signal, a second pulse signal of an address transition detection signal generated after the first pulse signal, and a delay control signal based on the first and second pulse signals, wherein the first pulse signal is removed from the delay control signal, and wherein the first circuit unit comprises, a first circuit that logically processes a peri-top address transition detection signal and a peri-bottom address transition detection signal to output the address transition detection signal, wherein said peri-top address transition signal and said peri-bottom address transition detection signal are respectively signals generated by combining the address transition detection signals at the peri-top and by combining the address transition detection signals at the peri-bottom; and a second circuit unit that receives the delay control signal and a coding signal and outputs a write control signal.

22. The circuit of claim 21, wherein the write control circuit comprises:

a first logic-gate that receives the peri-top address transition detection signal and the peri-bottom address transition detection;

a second logic-gate that logically processes an output signal from the first logic-gate;

a third logic-gate that receives the write enable signal and a chip selection signal;

a first delay unit that delays an output signal from the third logic-gate;

a fourth logic-gate that receives an output signal from the third logic-gate and an output from the first delay unit;

a second delay unit that delays an output signal from the fourth logic-gate;

a fifth logic-gate that receives an output signal from the second logic-gate and an output signal from the second delay unit;

a sixth logic-gate that logically processes an output signal from the fifth logic-gate;

a seventh logic-gate that receives an output signal from the sixth logic-gate and the coding signal; and an eighth logic-gate that logically processes an output signal from the seventh logic-gate and outputs the write control signal.

23. The circuit of claim 21, wherein the write control circuit comprises:

a first logic-circuit that receives a first and second address transition detection signals based on a single transition of an address signal; and a second logic-circuit that receives a write enable signal and a chip selection signal;

a first delay unit that delays an output signal from the second logic-circuit;

a third logic-circuit that receives an output signal from the second logic-circuit and an output from the first delay unit;

a second delay unit that delays an output signal from the third logic-circuit;

a fourth logic-circuit that receives an output signal from the first logic-circuit and an output signal from the second delay unit; and a fifth logic-circuit that receives an output signal from the fourth logic-circuit and a coding signal and outputs a write control signal.

* * * * *